United States Patent
Lee

(10) Patent No.: US 10,062,707 B2
(45) Date of Patent: Aug. 28, 2018

(54) SEMICONDUCTOR DEVICE AND METHOD OF MANUFACTURING THE SAME

(71) Applicant: SK hynix Inc., Icheon-si Gyeonggi-do (KR)

(72) Inventor: Hyun Ho Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/601,474

(22) Filed: May 22, 2017

(65) Prior Publication Data

US 2018/0138195 A1 May 17, 2018

(30) Foreign Application Priority Data

Nov. 14, 2016 (KR) .................. 10-2016-0151070

(51) Int. Cl.
| | | |
|---|---|---|
| H01L 29/792 | (2006.01) | |
| H01L 27/11582 | (2017.01) | |
| H01L 21/02 | (2006.01) | |
| H01L 21/28 | (2006.01) | |
| H01L 27/24 | (2006.01) | |
| H01L 29/08 | (2006.01) | |
| H01L 29/10 | (2006.01) | |
| H01L 29/423 | (2006.01) | |
| H01L 29/51 | (2006.01) | |
| H01L 45/00 | (2006.01) | |
| H01L 27/115 | (2017.01) | |
| H01L 27/11568 | (2017.01) | |

(52) U.S. Cl.
CPC .. *H01L 27/11582* (2013.01); *H01L 21/02639* (2013.01); *H01L 21/28282* (2013.01); *H01L 27/249* (2013.01); *H01L 29/0847* (2013.01); *H01L 29/1037* (2013.01); *H01L 29/42348* (2013.01); *H01L 29/518* (2013.01); *H01L 45/06* (2013.01)

(58) Field of Classification Search
None
See application file for complete search history.

(56) References Cited

U.S. PATENT DOCUMENTS

2016/0079267 A1* 3/2016 Fukuzumi ......... H01L 27/11582
257/314

FOREIGN PATENT DOCUMENTS

| KR | 1020120029194 A | 3/2012 |
|---|---|---|
| KR | 1020160020210 A | 2/2016 |
| KR | 1020170065290 A | 6/2017 |

* cited by examiner

*Primary Examiner* — Kimberly Rizkallah
*Assistant Examiner* — Bo Bin Jang
(74) *Attorney, Agent, or Firm* — William Park & Associates Ltd.

(57) ABSTRACT

Provided here may be a semiconductor device and a method of manufacturing the same. The semiconductor device may include a first source seed layer, a second source seed layer disposed over the first source seed layer at a position spaced apart from the first source seed layer with a source area interposed between the first source seed layer and the second source seed layer, cell plugs configured to penetrate through the second source seed layer and extend into the source area, the cell plugs being disposed at positions spaced apart from the first source seed layer. The semiconductor device may also include an interlayer source layer configured to fill the source area.

11 Claims, 13 Drawing Sheets

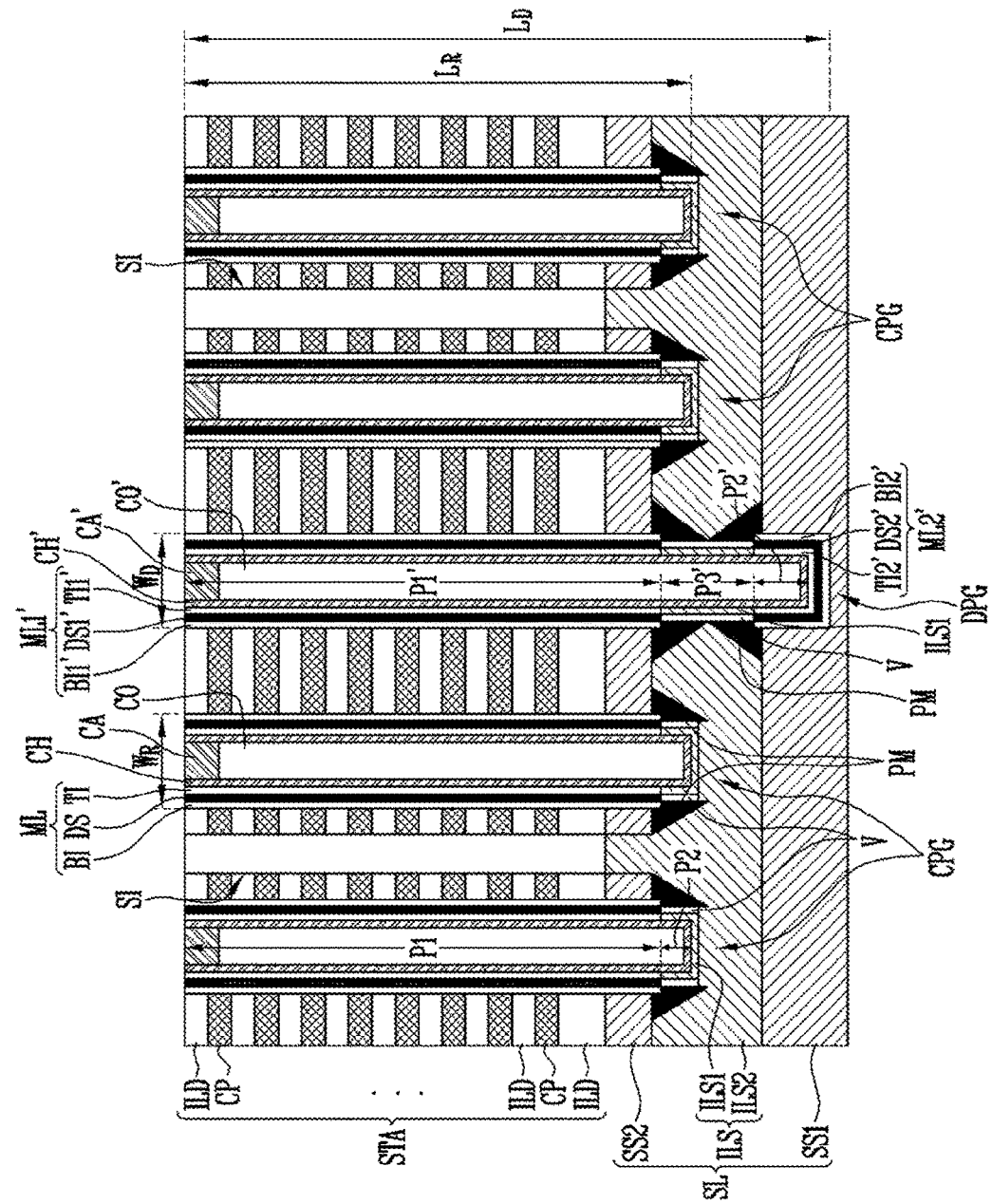

SEMICONDUCTOR DEVICE AND METHOD OF MANUFACTURING THE SAME

CROSS-REFERENCE TO RELATED APPLICATION

The present application claims priority under 35 U.S.C. § 119(a) to Korean patent application number 10-2016-0151070 filed on Nov. 14, 2016 in the Korean Intellectual Property Office, the entire disclosure of which is incorporated herein by reference.

BACKGROUND

1. Technical Field

Various embodiments of the present disclosure relate to a semiconductor device and a method of manufacturing the same, and more particularly, to a three-dimensional semiconductor memory device and a method of manufacturing the same.

2. Related Art

Semiconductor memory devices include a plurality of memory cells which are configured to store data. For high integration of semiconductor memory devices, the memory cells may be arranged in three dimensions.

A three-dimensional semiconductor memory device in which memory cells are arranged in three dimensions includes interlayer insulating layers and word lines which are alternately stacked, and a channel layer formed in a channel hole passing through the interlayer insulating layers and the word lines. Memory cells are stacked along the channel layer. A memory layer including at least one of a tunnel insulating layer, a data storage layer, and a blocking insulating layer is formed to enclose the channel layer. The channel layer may be coupled to a bit line and a source layer.

As the number of stacked memory cells is increased, the level of difficulty in coupling the channel layer with the source layer is being increased. Furthermore, it is becoming difficult to reliably secure electrical characteristics of the source layer.

SUMMARY

Various embodiments of the present disclosure are directed to a semiconductor device which may reliably secure the electrical characteristics of a source layer, and a method of manufacturing the semiconductor device.

An embodiment of the present disclosure may provide for a semiconductor device. The semiconductor device may include a first source seed layer; a second source seed layer disposed over the first source seed layer at a position spaced apart from the first source seed layer with a source area interposed between the first source seed layer and the second source seed layer; cell plugs configured to penetrate through the second source seed layer and extend into the source area, the cell plugs being disposed at positions spaced apart from the first source seed layer; and an interlayer source layer configured to fill the source area.

The semiconductor device may further include at least one dummy plug configured to penetrate through the second source seed layer and extend into the first source seed layer via the source area.

An embodiment of the present disclosure may provide for a method of manufacturing a semiconductor device. The method may include: forming a preliminary source stack structure including a first source seed layer, a sacrificial layer, and a second source seed layer that are successively stacked; forming first channel layers that penetrate through the second source seed layer and extend into the sacrificial layer, each of the first channel layers being enclosed by a multilayer layer; removing the sacrificial layer and the multilayer layer through a source through hole such that a source area to be formed to expose bottoms of the first channel layers opens between the first source seed layer and the second source seed layer; and growing an interlayer source layer from the first channel layers, the first source seed layer, and the second source seed layer that are exposed in the source area.

The method may further include forming at least one second channel layer that penetrates the second source seed layer and the sacrificial layer and extends into the first source seed layer, the second channel layer being enclosed by the multilayer layer.

BRIEF DESCRIPTION OF THE DRAWINGS

FIG. 1 is a sectional view illustrating a semiconductor device in accordance with an embodiment of the present disclosure;

DETAILED DESCRIPTION

Figure 2A:
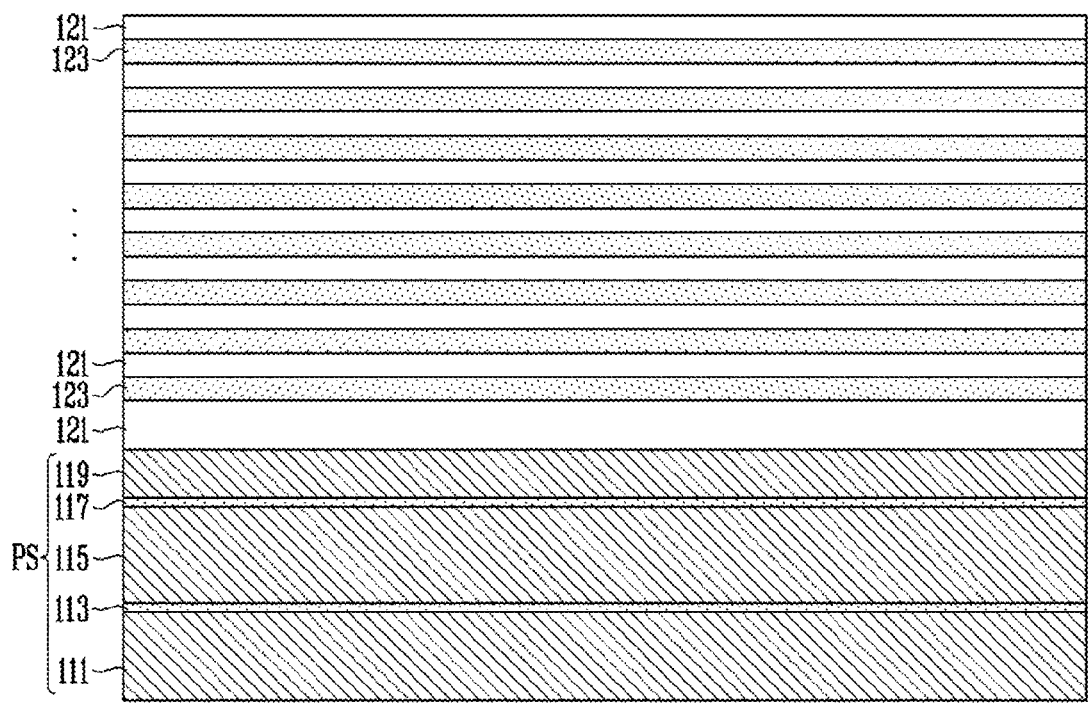
FIGS. 2A to 2K are sectional views illustrating a method of manufacturing the semiconductor device in accordance with an embodiment of the present disclosure.

Example embodiments will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings may denote like elements.

Terms such as 'first' and 'second' may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as the form is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a sectional view illustrating a semiconductor device in accordance with an embodiment of the present disclosure.

Referring to FIG. 1, the semiconductor device in accordance with the embodiment of the present disclosure includes a multilayer source layer SL, a stack structure STA, cell plugs CPG, and a dummy plug DPG.

In the present disclosure, for the sake of explanation, it is assumed that four cell plugs CPG are provided and a single dummy plug DPG is disposed between the four cell plugs CPG. However, the present disclosure is not limited to this. For example, to support the configuration of the multilayer source layer SL, a plurality of dummy plugs DPG may be provided at required positions between the cell plugs CPG.

Although not illustrated in the drawing, drive transistors that form a circuit for driving a memory string of the semiconductor device may be disposed under the multilayer source layer SL of the semiconductor device in accordance with an embodiment of the present disclosure. In addition, some of the drive transistors and the multilayer source layer SL may be electrically coupled with each other through a routing line or a contact plug.

Referring to FIG. 1, the multilayer source layer SL includes a first source seed layer SS1, an interlayer source layer ILS, and a second source seed layer SS2.

The second source seed layer SS2 is spaced apart from the first source seed layer SS1 with a source area OPS (see FIG. 2K) interposed therebetween and is disposed over the first source seed layer SS1. The interlayer source layer ILS is disposed to fill the source area between the first source seed layer SS1 and the second source seed layer SS2.

The first source seed layer SS1 and the second source seed layer SS2 may be formed of material capable of functioning as a growth seed for the interlayer source layer ILS. Furthermore, the first source seed layer SS1 and the second source seed layer SS2 may be formed of the same material. For example, the first source seed layer SS1 and the second source seed layer SS2 may include silicon.

The first source seed layer SS1 and the second source seed layer SS2 may be formed of a material capable of supplying an impurity to the interlayer source layer ILS. For example, the first source seed layer SS1 and the second source seed layer SS2 may include an n-type or p-type impurity.

The interlayer source layer ILS may be a material layer that is grown from channel layers CH and CH', the first source seed layer SS1 and the second source seed layer SS2, and may include silicon. The interlayer source layer ILS may include an impurity supplied from the first source seed layer SS1 and the second source seed layer SS2. For instance, the interlayer source layer ILS may include an n-type or p-type impurity.

The interlayer source layer ILS may supply impurities to the channel layers CH and CH'.

The second source seed layer SS2 may be formed of polysilicon having a high etching selectivity relative to oxide. Therefore, the second source seed layer SS2 may function as an etch blocking layer during an operation of forming slits SI which will be described later herein.

Although not illustrated in the drawing, the multilayer source layer SL may include a metal source layer (not illustrated) which is disposed thereunder. The metal source layer (not illustrated) may be formed of a material having resistance lower than that of the first source seed layer SS1, the second source seed layer SS2, and the interlayer source layer ILS. Furthermore, a barrier metal layer (not illustrated) may be further formed between the metal source layer (not illustrated) and the multilayer source layer SL.

The stack structure STA is disposed on the multilayer source layer SL. The stack structure STA includes interlayer insulating layers ILD and conductive patterns CP which are alternately stacked on the second source seed layer SS2. The conductive patterns CP may be used as gate electrodes of select transistors and memory cells. The interlayer insulating layers ILD may function to insulate the conductive patterns CP from each other. Each conductive pattern CP may include at least one of a polysilicon, a metal, and a metal silicide. Each interlayer insulating layer ILD may include an oxide.

The slits SI may pass through the stack structure STA. Although not illustrated in FIG. 1, a sidewall insulating layer may be formed in each of the slits SI. The sidewall insulating layer is provided to protect the interlayer insulating layers ILD, the conductive patterns CP, and the second source seed layer SS2 from an etching process. The sidewall insulating layer may be made of material different from that of the interlayer insulating layers ILD, the conductive patterns CP, and the second source seed layer SS2. The side insulating layer may be formed on a sidewall of each of the silts SI.

Each of the cell plugs CPG includes a multilayer pattern ML and the channel layer CH. Each cell plug CPG may further include a core insulating layer CO and a capping layer CA. The multilayer pattern ML includes a blocking insulating pattern BI, a data storage pattern DS, and a tunnel insulating pattern TI.

The dummy plug DPG includes first and second multilayer patterns ML1' and ML2' and a channel layer CH'. Furthermore, the dummy plug DPG may further include a core insulating layer CO' and a capping layer CA'. The first multilayer pattern ML1' includes a first blocking insulating pattern BI1', a first data storage pattern DS1', and a first tunnel insulating pattern TI1'. The second multilayer pattern ML2' includes a second blocking insulating pattern BI2', a second data storage pattern DS2', and a second tunnel insulating pattern TI2'. In one example, the multilayer pattern ML and the first and second multilayer patterns ML1' and ML2' may be formed of a same material.

In accordance with an embodiment of the present disclosure, each of the cell plugs CPG and the dummy plug DPG may have the same stacked structure, but differ in dimensions (e.g., a length or width) from each other.

When each of the cell plugs CPG has a width $W_R$, the dummy plug DPG may have a width $W_D$ greater than the width $W_R$. When each of the cell plugs CPG has a length $L_R$, the dummy plug DPG may have a length $L_D$ greater than the length $L_R$. That is, although the dummy plug DPG has the same stacked structure as that of each of the cell plugs CPG, the dummy plug DPG is greater in dimensions than the cell plug CPG.

The cell plugs CPG and the dummy plug DPG may extend to penetrate through the interlayer insulating layer ILD and the conductive patterns CP. However, unlike the cell plugs CPG that extend to only the interlayer source layer ILS, the dummy plug DPG extends toward the first source seed layer SS1 and penetrates through an upper portion of the first source seed layer SS1. Thus, the dummy plug DPG may penetrate through the second source seed layer SS2 and extend into the first source seed layer SS1 via the source area. Therefore, the dummy plug DPG may stably support the first source seed layer SS1, the second source seed layer SS2, and the stack structure STA when the source area between the first source seed layer SS1 and the second source seed layer SS2 in which the interlayer source layer ILS is disposed is opened.

Having a critical dimension (CD) greater than that of the cell plugs CPG, the dummy plug DPG may more stably support the first source seed layer SS1, the second source seed layer SS2, and the stack structure STA.

The dummy plug DPG may be used as a support structure for the first source seed layer SS1 and the second source seed layer SS2 rather than being used as a memory cell.

The dummy plug DPG may be formed using a same process as forming the cell plugs CPG. Therefore, there is no burden of an additional process, and the production cost is reduced. For instance, the dummy plug DPG may be formed to have length and width different from those of the cell plugs CPG by adjusting the shape of an etching mask and an etching rate.

Hereinbelow, the structures of the cell plugs CPG and the dummy plug DPG along with the interlayer source layer ILS will be described in more detail.

First, the detailed structure of the cell plugs CPG will be described in detail together with the interlayer source layer ILS.

The channel layer CH of each of the cell plugs CPG is disposed in a corresponding channel hole that passes through the stack structure STA and the second source seed layer SS2 and extends into the interlayer source layer ILS. Thus, the cell plugs CPG may penetrate through the second source seed layer SS2 and extend into the source area, where the cell plugs CPG may be disposed at positions spaced apart from the first source seed layer SS1.

Each channel layer CH may have a tubular shape, enclosing a core insulating layer CO. In this case, the height of the core insulating layer CO may be less than that of the channel layers CH. A capping layer CA may be further formed in an upper end of the core insulating layer CO. The capping layer CA may be enclosed by an upper end of the associated channel layer CH.

The channel layers CH and the capping layer CA may be formed of semiconductor material. The capping layer CA may include an impurity having a high level of concentration compared to that of the channel layers CH.

Although not illustrated in FIG. 1, in some cases the capping layer CA and the core insulating layer CO may not be formed. In this case, each of the channel layers CH may be formed in an embedded form in which the channel hole is completely filled therewith.

Each of the channel layers CH may be used as a channel of a memory string.

Each slit SI may be disposed between corresponding adjacent channel layers CH.

Each of the channel layers CH may be divided into a first part P1 and a second part P2. The first part P1 passes through the stack structure STA and the second source seed layer SS2. The second part P2 passes through some of the upper portion of the interlayer source layer ILS. The second part P2 is disposed under the first part P1. The second part P2 of each of the channel layers CH makes contact with the interlayer source layer ILS.

The interlayer source layer ILS includes a first area ILS1 and a second area ILS2. The first area ILS1 and the second area ILS2 are disposed in the source area defined between the first source seed layer SS1 and the second seed layer SS2.

The first area ILS1 of the interlayer source layer ILS grows from the channel layers CH. To form the interlayer source layer ILS, a selective growth method may be used. In detail, the first area ILS1 may grow from the second part P2 of each channel layer CH sideways and downward. To form the first area ILS1, a selective polycrystalline silicon growing (SPG) method may be used.

The second area ILS2 of the interlayer source layer ILS may be formed using the first source seed layer SS1 and the second source seed layer SS2 as a growth seed layer. In detail, the second area ILS2 may grow from an upper surface of the first source seed layer SS1 and a lower surface of the second source seed layer SS2. Furthermore, the second area ILS2 may grow from side surfaces of the second source seed layer SS2 that are exposed through the slits SI. The second area ILS2 may be formed by a selective polycrystalline silicon growing method.

An outer surface of the first part P1 of each channel layer CH may be enclosed by the corresponding multilayer pattern ML. The multilayer pattern ML may include a tunnel insulating pattern TI which encloses the outer surface of the first part P1, a data storage pattern DS which encloses the tunnel insulating pattern TI, and a blocking insulating pattern BI which encloses the data storage pattern DS.

The tunnel insulating pattern TI is a portion of the tunnel insulating layer. The data storage pattern DS is a portion of the data storage layer. The blocking insulating pattern BI is a portion of the blocking insulating layer. The data storage layer may include silicon, nitride, phase-change material, nanodots, etc. The tunnel insulating layer may include a silicon oxide layer capable of tunneling. The blocking insulating layer may include an oxide layer capable of blocking charges.

The outer surface of the second part P2 of each channel layer CH may be enclosed by the first area ILS1 of the interlayer source layer ILS. Furthermore, the first area ILS1 makes direct contact with the second part P2. Each channel layer CH extends into the interlayer source layer ILS to a distance greater than do the corresponding multilayer pattern ML.

The detailed structure of the dummy plug DPG will be described in detail together with the interlayer source layer ILS.

The channel layer CH' of the dummy plug DPG is disposed in the channel hole that passes through the stack structure STA, the second source seed layer SS2 and the interlayer source layer ILS and extends into the first source seed layer SS1.

The channel layer CH' may be divided into first to third parts P1' to P3'. The first part P1' passes through the stack structure STA and the second source seed layer SS2. The second part P2' passes through some of an upper portion of the first source seed layer SS1 via the source area. The third part P3' is disposed between the first part P1' and the second part P2'. The third part P3' makes contact with the first area ILS1 of the interlayer source layer ILS grown from the channel layer CH'.

An outer surface of the first part P1' of the channel layer CH' may be enclosed by the first multilayer pattern ML1'. The first multilayer pattern ML1' may include a first tunnel insulating pattern TI1' which encloses an outer surface of the first part P1', a first data storage pattern DS1' which encloses the first tunnel insulating pattern TI1', and a first blocking insulating pattern BI1' which encloses the first data storage pattern DS1'.

The multilayer patterns ML that enclose the respective outer surfaces of the first parts P1 of the channel layers CH of the cell plugs, and the first multilayer pattern ML1' that encloses the outer surface of the first part P1' of the channel layer CH' of the dummy plug DPG may be formed in the same layers.

An outer surface of the second part P2' of the channel layer CH' may be enclosed by the second multilayer pattern ML2'. The outer surface of the second part P2' of the channel layer CH' may penetrate through an upper portion of the first source seed layer SS1. The second multilayer pattern ML2' may include a second tunnel insulating pattern TI2' which encloses an outer surface of the second part P2', a second data storage pattern DS2' which encloses the second tunnel insulating pattern TI2', and a second blocking insulating pattern BI2' which encloses the second data storage pattern DS2'.

The first multilayer pattern ML1' and the second multilayer pattern ML2' of the channel layer CH' may be separated from each other by the interlayer source layer ILS. The first tunnel insulating pattern TI1' and the second tunnel insulating pattern TI2' are parts of the tunnel insulating layer that are separated from each other by the interlayer source layer ILS. The first data storage pattern DS1' and the second data storage pattern DS2' are parts of the data storage layers that are separated from each other by the interlayer source layer ILS. The first blocking insulating pattern BI1' and the second blocking insulating pattern BI2' are parts of the blocking insulating layer that are separated from each other by the interlayer source layer ILS.

Referring to FIG. 1, polymers PM may remain in the source area between the first source seed layer SS1 and the second source seed layer SS2.

The polymers PM may be generated during an operation of opening the source area in which the interlayer source layer ILS is disposed. For example, when a sacrificial layer which may be disposed between the first source seed layer SS1 and the second source seed layer SS2 is etched to open the source area, the polymers PM may be generated by reaction between the sacrificial layer and etching material.

The polymers PM may remain in corners of an internal space of the source area. For example, the polymers PM may remain in junctions between the side surfaces of the cell plugs CPG and the lower surface of the second source seed layer SS2. The polymers PM may also remain in junctions between the side surface of the dummy plug DPG and the upper surface of the first source seed layer SS1 and junctions between the side surface of the dummy plug DPG and the lower surface of the second source seed layer SS2. Vortexes of fluid may be generated in the junctions when materials for growth of the interlayer source layer ILS are drawn from the slits SI into the source area. Thereby, etching remnants may be easily stacked.

The polymers PM may impede the growth of the interlayer source layer ILS into the source area.

The polymers PM that have been generated when the source area is opened may be increased in size during an operation of growing the interlayer source layer ILS from the first source seed layer SS1 and the second source seed layer SS2. This may be because the etching remnants and the materials for growth of the interlayer source layer may react to each other. Therefore, the growth of the interlayer source layer ILS in the source area may be further impeded.

The polymers PM may cause formation of voids V in the source area. The voids V may be formed between the polymers PM and the first area ILS1 of the interlayer source layer ILS.

There is the possibility that the voids V block the coupling of the interlayer source layer ILS with the channel layers CH and CH'. Therefore, there is the probability of an undesirable disconnection between the channel layers CH and CH' and the source layer ILS.

In an embodiment of the present disclosure, lower ends of the cell plugs CPG are disposed between the first source seed layer SS1 and the second source seed layer SS2, that is, in the interlayer source layer ILS. Thereby, a path along which materials for growth of the interlayer source layer ILS are moved, the path may be formed in the source area between the first source seed layer SS1 and the second source seed layer SS2. That is, even if the polymers PM are generated in the source area, a space allowing the interlayer source layer ILS to grow may be secured under the lower ends of the cell plugs CPG.

Therefore, even if voids V are formed by the polymers PM, a connection between the channel layer and the source layer may be maintained through the first area ILS1 and the second area ILS2 of the interlayer source layer ILS that have been grown from the respective second parts P2 of the channel layers CH.

Because the lower end of the dummy plug DPG is disposed in the first source seed layer SS1, as shown in FIG. 1, a connection between the channels layer CH' and the second area ILS2 of the interlayer source layer ILS may be completely blocked by the voids V that are formed by the polymers PM.

The dummy plug DPG does not function as a memory cell, so that the blocking of the connection has no effect on operation of the semiconductor memory device.

Because the lower end of the dummy plug DPG is disposed in the first source seed layer SS1, the dummy plug DPG may function to support the stack structure STA, the first source seed layer SS1, and the second source seed layer SS2 when the source area opens.

In an embodiment of the present disclosure, a select transistor is formed in a junction between a select line among the conductive patterns CP and each channel layer CH of the cell plugs CPG, and a memory cell is formed in a junction between a word line among the conductive patterns CP and each channel layer CH. The uppermost and lowermost conductive patterns among the conductive patterns CP may be respectively used as an upper select line and a lower select line. Conductive patterns disposed between the uppermost and lowermost conductive patterns among the conductive patterns CP may be used as word lines. In accordance with the foregoing configuration, each of the channel layers CH of the cell plugs CPG may couple in series an upper select transistor coupled to the upper select line, a lower select transistor coupled to the lower select line, and memory cells coupled to the word lines. The memory string includes the upper select transistor, the memory cells, and the lower select transistor that are coupled in series to each other.

FIGS. 2A to 2K are sectional views illustrating a method of manufacturing the semiconductor device in accordance with an embodiment of the present disclosure. In detail, FIGS. 2A to 2K are sectional views illustrating a method of manufacturing the semiconductor device shown in FIG. 1.

Referring to FIG. 2A, a preliminary source stack structure PS may be formed on a substrate (not illustrated) including a lower structure. Although not illustrated, the lower structure may include drive transistors which form a circuit for driving memory strings of the semiconductor device, and a contact plug and routing lines which are coupled to the drive transistors.

The preliminary source stack structure PS may be formed by successively stacking a first source seed layer 111, a sacrificial layer 115, and a second source seed layer 119. The first source seed layer 111 and the second source seed layer 119 may be formed of the same material and may be used as a growth seed layer of an interlayer source layer during a following process. The first source seed layer 111 and the second source seed layer 119 may be formed of material capable of supplying an impurity to the interlayer source layer during a following process. The sacrificial layer 115 may be formed of selectively-removable material during a following process.

In detail, the sacrificial layer 115 may be formed of material having an etching selectivity different from that of the first source seed layer 111 and the second source seed layer 119. The first source seed layer 111 and the second source seed layer 119 may function as a growth seed layer of the interlayer source layer and may be formed of a doped silicon layer capable of supplying an impurity to the interlayer source layer. The doped silicon layer may include an n- or p-type impurity. The impurity may be added through an implant process after each of the first and second source seed layers 111 and 119 is deposited. The sacrificial layer 115 may be formed of an undoped polysilicon layer.

The preliminary source stack structure PS may further include first and second protective layers 113 and 117. To interpose the sacrificial layer 115 between the first protective layer 113 and the second protective layer 117, the first protective layer 113 is deposited before the sacrificial layer is formed, and the second protective layer 117 is deposited after the sacrificial layer 115 is formed. The first protective layer 113 is disposed between the sacrificial layer 115 and the first source seed layer 111, whereas the second protective layer 117 is disposed between the sacrificial layer 115 and the second source seed layer 119. The first protective layer 113 and the second protective layer 117 may be formed of a material having an etching selectivity different from that of the first source seed layer 111, the sacrificial layer 115, and the second source seed layer 119. Furthermore, the first protective layer 113 and the second protective layer 117 may be formed taking into account an etching selectivity relative to a multilayer layer to be formed in a following process.

Each of the first protective layer 113 and the second protective layer 117 may be formed of multi-layers. In detail, each of the first protective layer 113 and the second protective layer 117 may be formed of multi-layers having a nitride layer/oxide layer/nitride layer structure or an oxide layer/nitride layer/oxide layer/nitride layer structure.

The first and second multilayer protective layers 113 and 117 including the foregoing materials may function as protective layers during a following process of etching the blocking insulating layer, the data storage layer, and the tunnel insulating layer to expose the channel layer.

As shown in FIG. 2A, first material layers 121 and second material layers 123 are alternately stacked on the second source seed layer 119.

The second material layers 123 may be formed of material different from that of the first material layers 121. For example, the first material layers 121 may be formed of an insulating material for interlayer insulating layers, whereas the second material layers 123 may be formed of a conductive material for forming conductive patterns.

Alternatively, the first material layers 121 may be formed of insulating material for interlayer insulating layers, whereas the second material layers 123 may be used as sacrificial layers and may be formed of sacrificial insulating material having an etching selectivity different from that of the first material layers 121. In this case, the first material layers 121 may be formed of a silicon oxide layer, and the second material layers 123 may be formed of a silicon nitride layer.

Alternately, the first material layers 121 may be used as sacrificial layers and may be formed of a sacrificial insulating material having an etching selectivity different from that of the second material layers 123, and the second material layers 123 may be formed of a conductive material for forming conductive patterns. In this case, the first material layers 121 may be formed of an undoped polysilicon layer, and the second material layers 123 may be formed of a doped polysilicon layer.

Figure 2B:
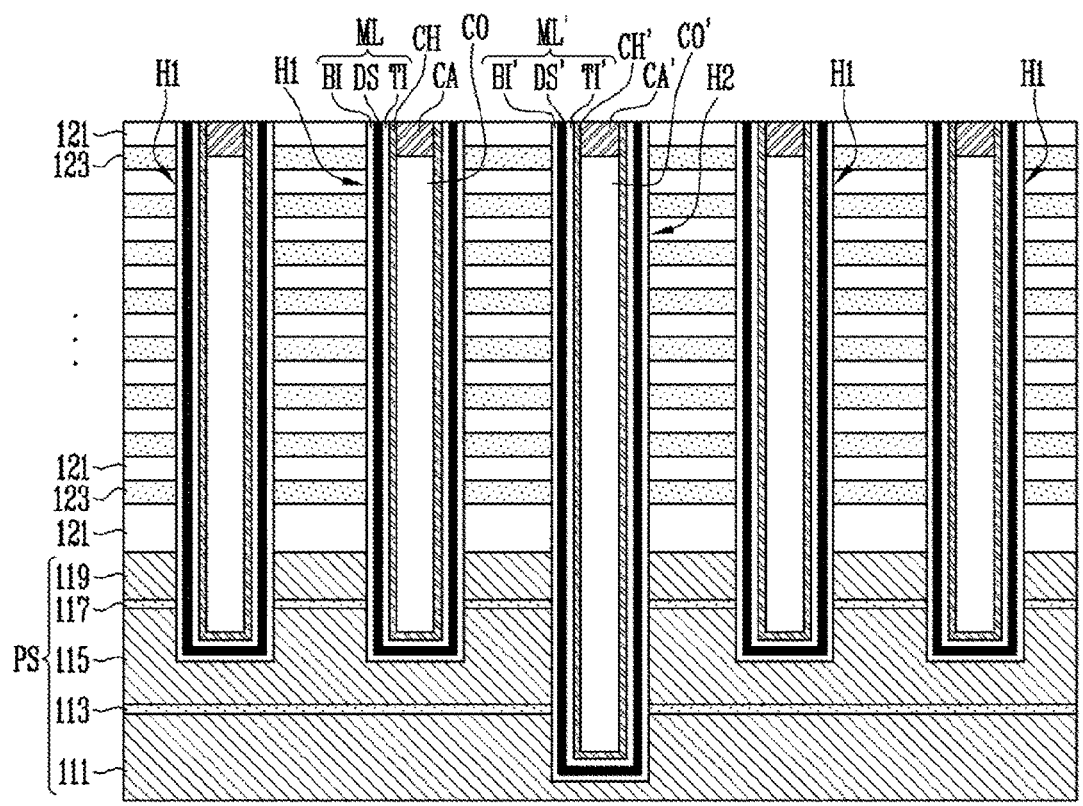

Referring to FIG. 2b, channel holes H1 and H2 are formed to pass through the first and second material layers 121 and 123 and at least a portion of the preliminary source stack structure PS. The channel holes H1 and H2 include first channel holes H1 and a second channel hole H2.

The first channel holes H1 are holes each of which is filled with a channel and a memory layer to form memory cells therein. That is, the first channel holes H1 are holes for forming the cell plugs CPG. The second channel hole H2 is a hole for forming a dummy structure although the second channel hole H2 is filled with the same material as that with which the first channel holes H1 are filled That is, the second channel hole H2 is a hole for forming the dummy plug DPG.

As described above, because the dummy plug DPG may have dimensions greater than each cell plug CPG, the second channel hole H2 may have dimensions greater than each first channel hole H1. An etching process for forming the channel holes H1 and H2 may be controlled such that the second channel hole H2 has dimensions greater than each first channel hole H1.

The first channel holes H1 may extend to completely pass through the second source seed layer 119 and the second protective layer 117 of the preliminary source stack structure PS. Each of the first channel holes H1 may extend to pass through a portion of the sacrificial layer 115 of the preliminary stack structure PS.

The second channel hole H2 may extend to completely pass through the second source seed layer 119, the second protective layer 117, the sacrificial layer 115, and the first protective layer 113 of the preliminary source stack structure PS. The second channel hole H2 may extend to pass through a portion of the first source seed layer 111 of the preliminary stack structure PS.

As such, each first channel hole H1 and the second channel hole H2 may extend to different lengths. That is, the second channel hole H2 extends toward the first source seed layer 111, where the second channel hole H2 may extend a length greater than that of each first channel hole H1.

Subsequently, a first channel layer CH enclosed by a multilayer layer ML is formed in each of the first channel holes H1. The first channel layer CH may penetrate through the second source seed layer 119 and may extend into the sacrificial layer 115.

The multilayer layer ML may be formed by successively stacking a blocking insulating layer BI, a data storage layer DS, and a tunnel insulating layer TI. The blocking insulating layer BI, the data storage layer DS, and the tunnel insulating layer TI may be formed on a surface of each of the first channel holes H1. The first channel layer CH may be formed on the tunnel insulating layer TI.

The first channel layer CH may be formed such that each of the first channels H1 is completely filled therewith leaving open a central area of each first channel hole H1. If the first channel layer CH is formed such that the central area of each first channel hole H is open, the central area of each first channel hole H may be filled with a core insulating layer CO. The core insulating layer CO may have a height less than a depth of each first channel hole H1. In this case, a capping layer CA may be formed on the core insulating layer CO so that an upper end of each first channel hole H1 is filled with the capping layer CA.

While the first channel holes H1 are filled with the above-mentioned material layers, the second channel hole H2 is also filled with the above-mentioned material layers.

That is, a second channel layer CH' enclosed by a multilayer layer ML' may be formed in the second channel hole H2. The multilayer layer ML' may be formed by successively stacking a blocking insulating layer BI', a data storage layer DS,' and a tunnel insulating layer TI'. The blocking insulating layer BI', the data storage layer DS', and the tunnel insulating layer TI' may be formed on a surface of the second channel hole H2. The second channel layer CH' may be formed on the tunnel insulating layer TI'.

The second channel layer CH' may be formed such that the second channel H2 is completely filled therewith leaving open a central area of the second channel hole H2. If the central area of the second channel hole H2 is open, the central area may be filled with a core insulating layer CO'. If the core insulating layer CO' has a height less than a depth of the second channel hole H2, a capping layer CA' may be further formed so that an upper end of the second channel hole H2 is filled therewith.

Because the second channel hole H2 has dimensions greater than that of each first channel hole H1, the second channel layer CH' formed in the second channel hole H2 has dimensions greater than that of each first channel layer CH.

The second channel layer CH' may penetrate the second source seed layer 119 and the sacrificial layer 115 and extend into the first source seed layer 111 a length greater than that of the first channel layer CH.

Figure 2C:
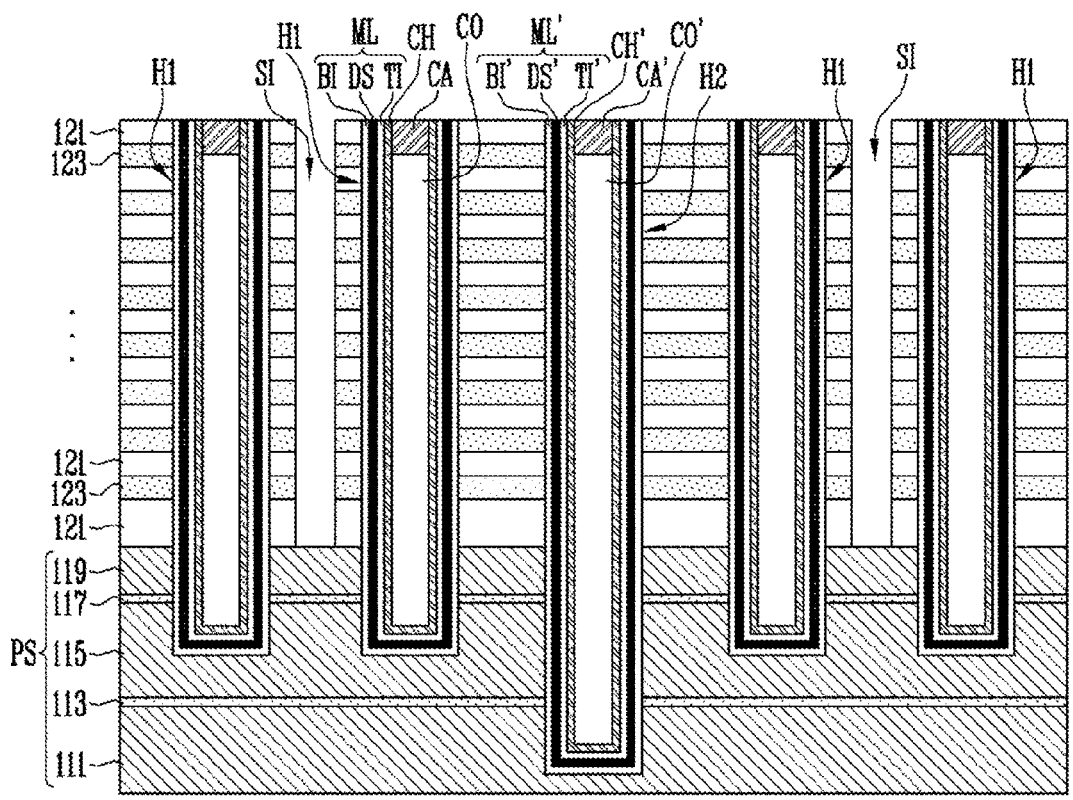

Referring to FIG. 2C, slits SI are formed to pass through the first and second material layers 121 and 123 by etching portions of the first and second material layers 121 and 123.

In the case where the first material layers 121 are formed of an insulating material for interlayer insulating layers and the second material layers 123 are formed of insulating layers for sacrificial layers, there may be used a difference in etching selectivity between the second source seed layer 119 formed of conductive material, such as doped silicone, and the first and second material layers 121 and 123 formed of the insulating material. In detail, during a process of etching the first and second material layers 121 and 123 formed of insulating material, the second source seed layer 119 formed of conductive material may be used as an etch blocking layer.

Hereinafter, for the sake of explanation, it is assumed that the first material layers 121 are formed of insulating material for interlayer insulating layers and the second material layers 123 are formed of insulating material for sacrificial layers.

Figure 2D:
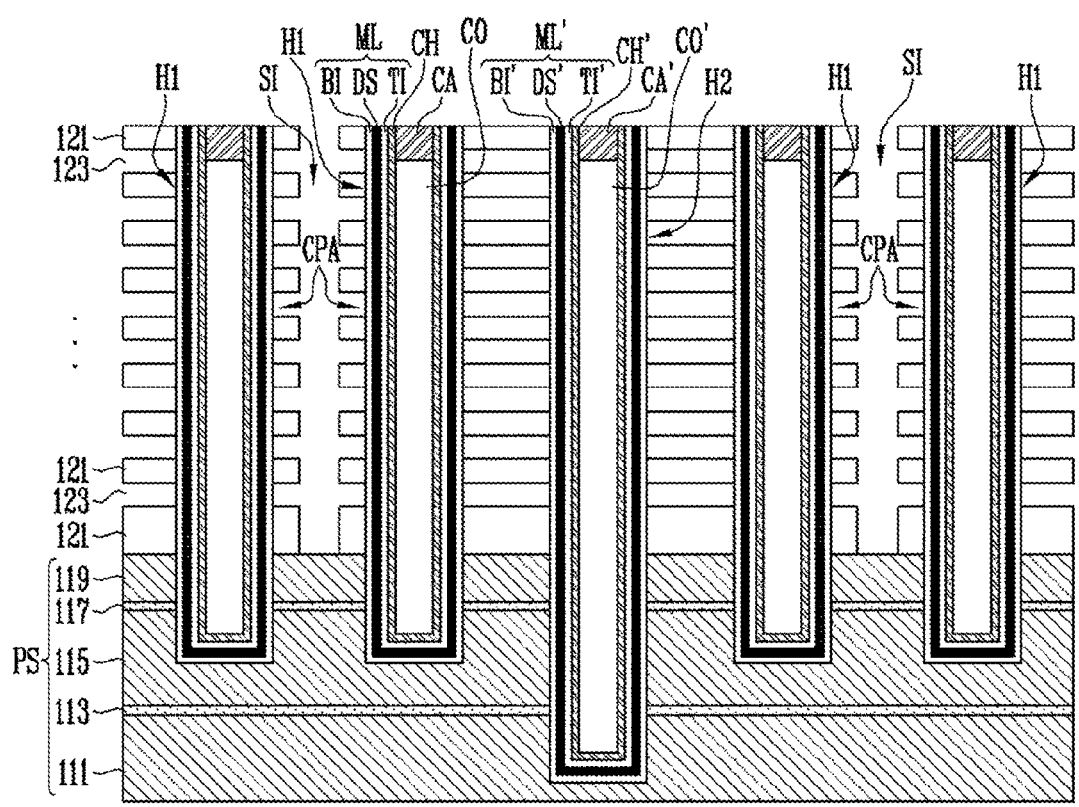

Referring to FIG. 2D, the second material layers 123 are selectively removed through the slits SI so as to open the conductive pattern areas CPA. In this regard, the channel layers CH and CH' are supported by the preliminary source stack structure PS, so that the entire structure thereof may be stably maintained.

Figure 2E:
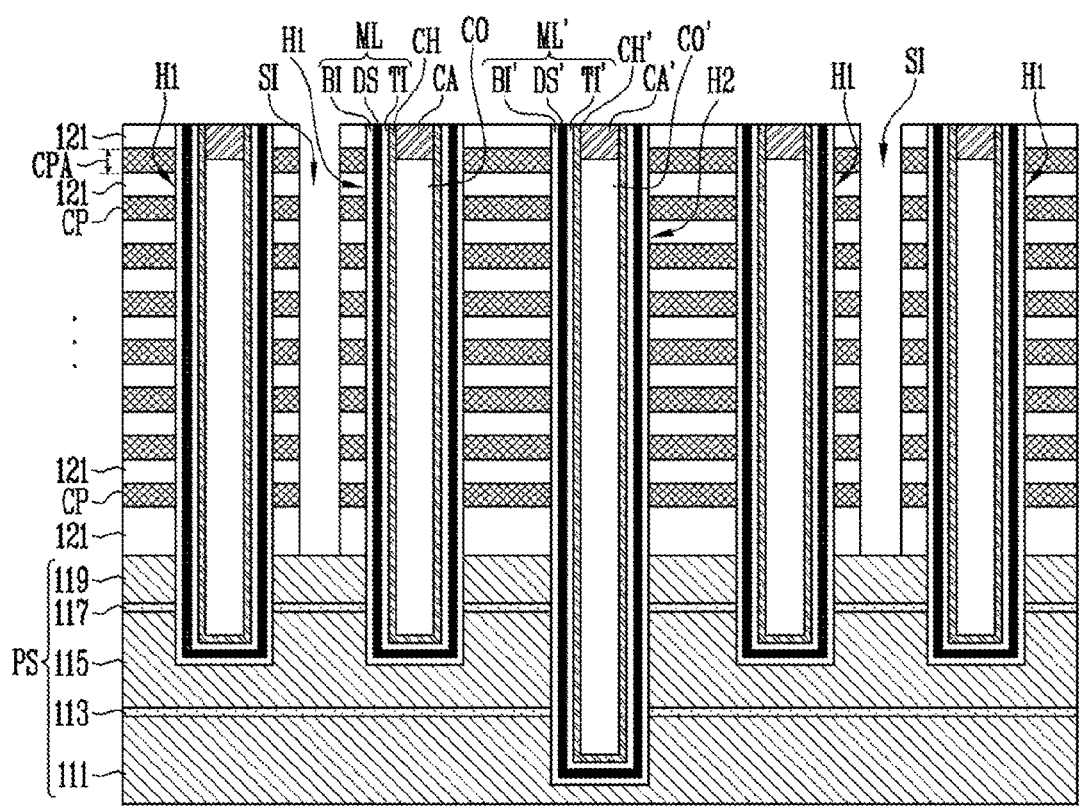

Referring to FIG. 2E, the conductive pattern areas CPA may be filled with respective third material layers through the slits SI. The third material layers may be made of conductive material. In this way, conductive patterns CP are formed in the conductive pattern areas CPA. The conductive patterns CP may include tungsten and the like.

Figure 2F:
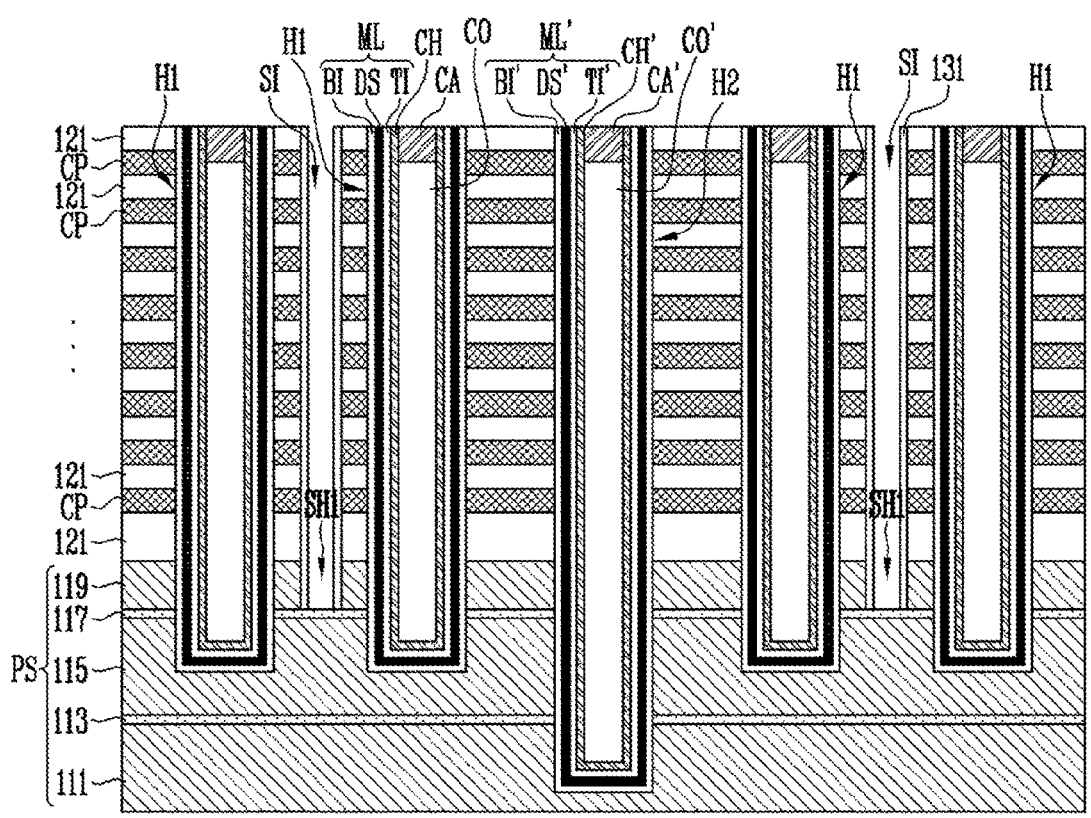

Referring to FIG. 2F, first source through holes SH1 passing through the second source seed layer 119 are formed by etching portions of the second source seed layer 119 that are exposed through the slits SI. The second protective layer 117 is exposed through the first source through holes SH1 passing through the second source seed layer 119. In this regard, the second protective layer 117 may be used as an etch blocking layer by a difference in etching selectivity between the second source seed layer 119 and the second protective layer 117.

Thereafter, a sidewall insulating layer 131 may be formed on a sidewall of each of the slits SI. The sidewall insulating layer 131 may be formed of a single nitride layer or a multilayer structure including a nitride layer and an oxide layer.

The sidewall insulating layer 131 may function to protect the conductive patterns CP and the second source seed layer 119 during a following process of removing the sacrificial layer 115. The sidewall insulating layer 131 may be formed of the same material layers as that of the first protective layer 113 or the second protective layer 117. For example, the sidewall insulating layer 131 may be formed of multi-layers having a nitride layer/oxide layer/nitride layer structure or an oxide layer/nitride layer/oxide layer/nitride layer structure.

Figure 2G:
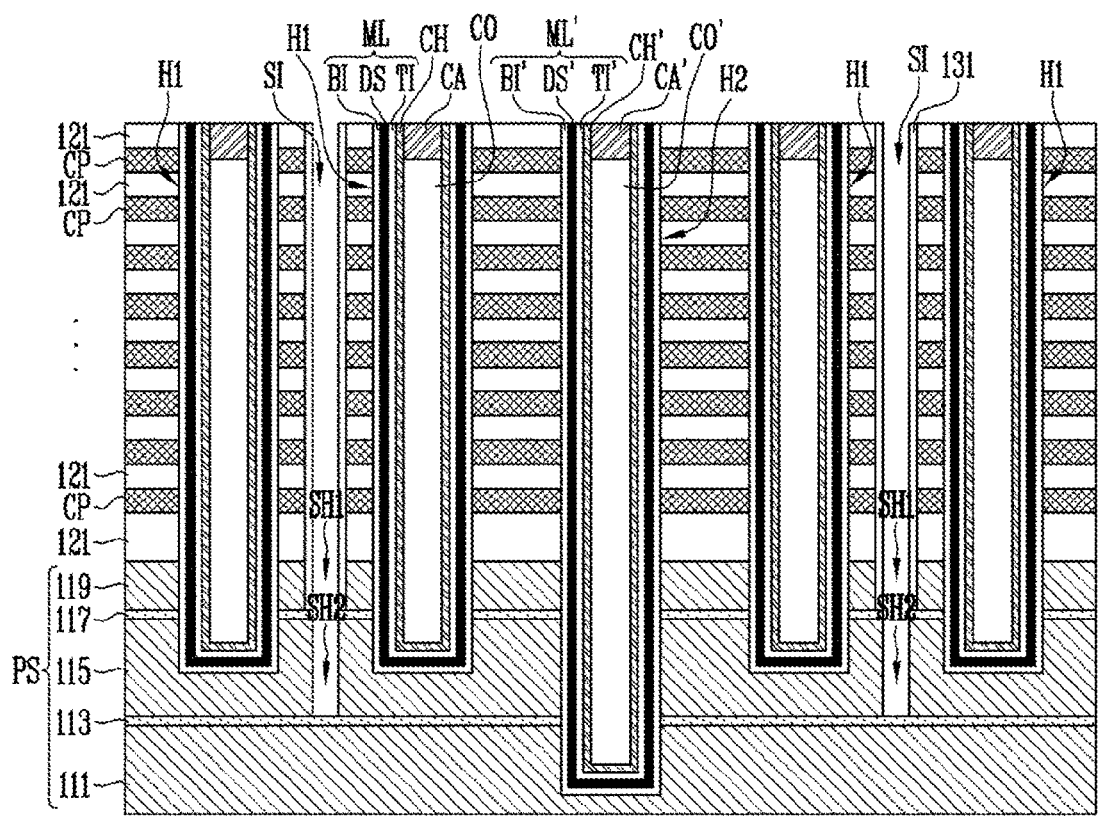

Referring to FIG. 2G, a second source through hole SH2 is formed by successively performing an operation of etching the second protective layer 117 exposed through each first source through hole SH1 and an operation of etching the sacrificial layer 115. The first protective layer 113 is exposed through the second source through holes SH2 passing through the second protective layer 117 and the sacrificial layer 115. In the operation of etching the sacrificial layer 115, the first protective layer 113 may be used as an etch blocking layer because of a difference in etching selectivity between the sacrificial layer 115 and the first protective layer 113.

Figure 2H:
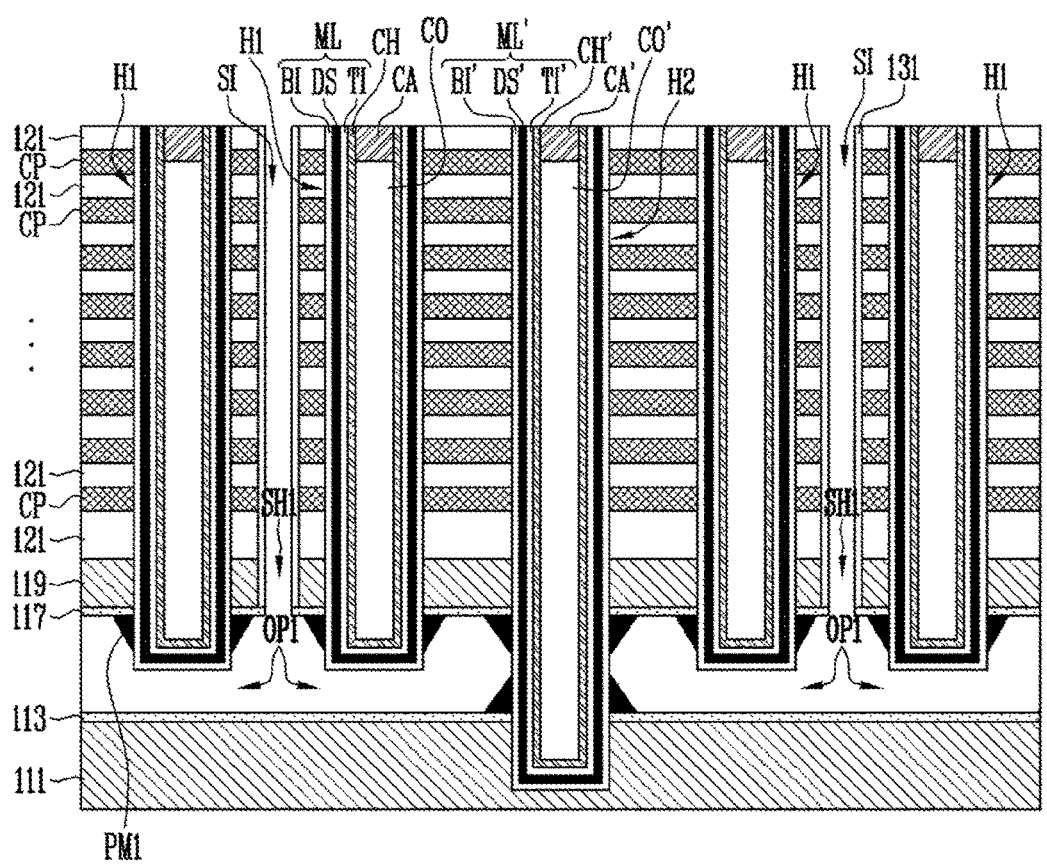

Referring to FIG. 2H, a first opening OP1 is formed between the first protective layer 113 and the second protective layer 117 by removing the sacrificial layer 115 exposed through the first and second source through holes SH1 and SH2. The first and second protective layers 113 and 117 may be used as etch blocking layers by a difference in etching selectivity between the sacrificial layer 115 and the first and second protective layers 113 and 117.

A portion of each of the multilayer layers ML and ML' may be exposed through the first opening OP1 formed by removing the sacrificial layer 115 (see FIG. 2G).

As mentioned above in the description of FIG. 1, polymers PM1 may be formed during the operation of removing the sacrificial layer 115. Referring again to FIG. 2H, the polymers PM1 may remain in junctions between side surfaces of the blocking insulating layers BI formed in the first channel holes H1 and a lower surface of the second protective layer 117. In addition, the polymers PM1 may remain in junctions between side surfaces of the blocking insulating layer BI' formed in the second channel hole H2 and an upper surface of the first protective layer 113, and in junctions between the side surfaces of the blocking insulating layer BI' and the lower surface of the second protective layer 117.

As described below, the formed polymers PM1 may be increased in size during an operation of growing the interlayer source layer, thus impeding the growth of the interlayer source layer in the source area OPS (see FIG. 2K) including the first opening OP1, second openings OP2 (see FIG. 2I), and third openings OP3 (see FIG. 2J).

Figure 2I:
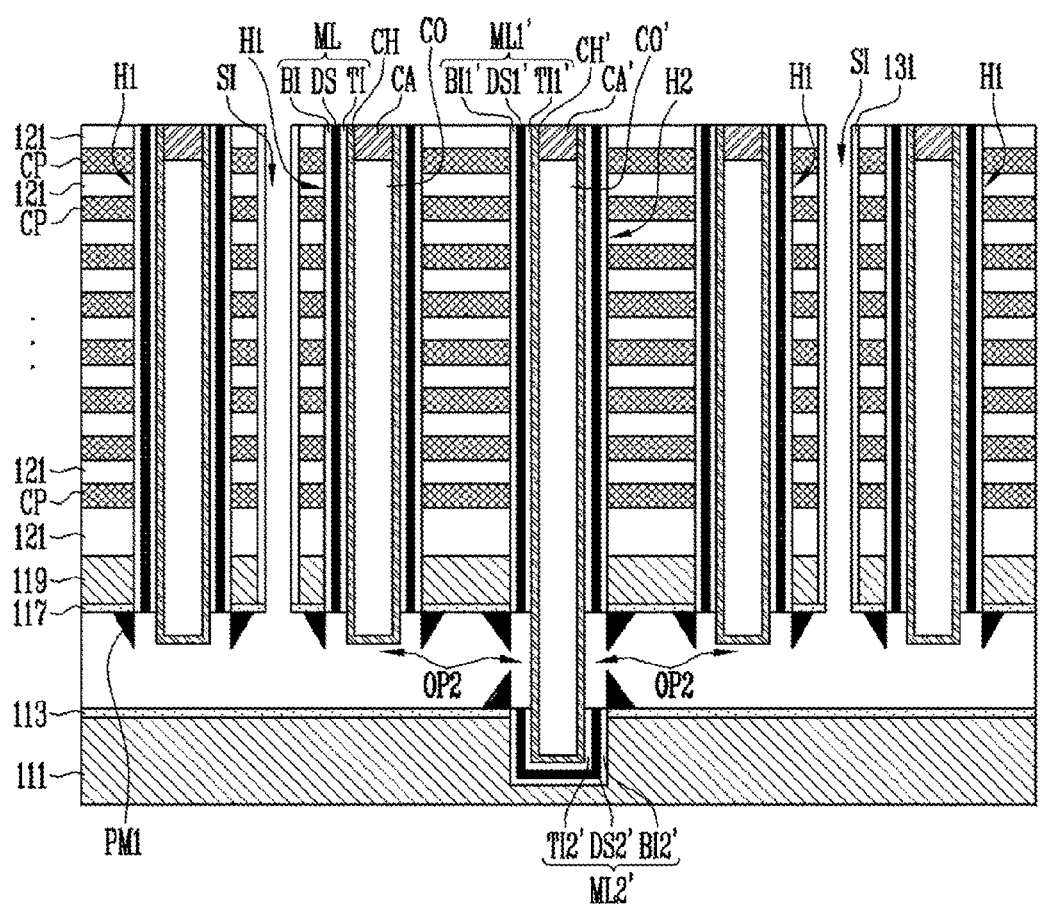

Referring to FIG. 2I, the second openings OP2, through which the respective channel layers CH and CH' are exposed, may be formed between the first protective layer 113 and the second protective layer 117 by etching corresponding portions of the channel layers CH and CH' exposed through the first opening OP1. The second openings OP2 may form the source area OPS along with the above-mentioned first opening OP1 and the third openings OP3 to be described later herein.

As shown in FIG. 2I, the second channel layer CH' extends, toward the first source seed layer 111, a length greater than that of the first channel layers CH. Therefore, a side surface of a lower portion of the second channel layer CH' is exposed. On the other hand, each of the first channel layers CH may have a lower end including a bottom surface which is exposed. In other words, the bottom surface of the first channel layers CH may be exposed in the source area OPS (see FIG. 2K). Further, the first channel layers CH do not extend to the first source see layer 111.

For example, in an operation of forming the second openings OP2, during the etching process of forming the second openings OP2, the blocking insulating layer BI' formed in the second channel hole H2 may be divided into first and second blocking insulating patterns BI1' and BI2' by etching. The lower end of the blocking insulating layer BI formed in each first channel hole H1 is etched. In this way, the data storage layers DS and DS' may be exposed. In this regard, the first protective layer 113 and the second protective layer 117 may have a multilayer structure including materials described with reference to FIG. 2A and remain rather than being removed during an operation of etching the blocking insulating layers BI and BI', thus functioning as protective layers. The multilayer structure may include a layer made of material having a high etching selectivity relative to the blocking insulating layers BI and BI'.

During the process of forming the second openings OP2, the data storage layer DS' formed in the second channel hole H2 may be etched and divided into the first and second data storage patterns DS1' and DS2'. A lower end of the data storage layer DS formed in each first channel hole H1 is etched. Thereby, the tunnel insulating layers TI and TI' may be exposed. Each of the first and second protective layers 113 and 117 has a multilayer structure including a layer with a high etching selectivity relative to the data storage layers DS and DS'. Therefore, while the data storage layers DS and DS' are etched, the first and second protective layers 113 and 117 remain rather than being removed, thus functioning as protective layers.

During the process of forming the second openings OP2, the tunnel layer TI' formed in the second channel hole H2 may be etched and divided into first and second tunnel insulating patterns TI1' and TI2'. The lower end of the tunnel insulating layer TI formed in each first channel hole H1 is etched. Thereby, the side surface of the lower portion of the second channel layer CH' may be exposed, and the lower end of each first channel layer CH may be exposed. Each of the first and second protective layers 113 and 117 has a multilayer structure including a layer with a high etching selectivity relative to the tunnel insulating layers TI and TI'. Therefore, while the tunnel insulating layers TI and TI' are etched, the first and second protective layers 113 and 117 remain rather than being removed, thus functioning as protective layers. Thus, the sacrificial layer 115 and the multilayer layers ML and ML' may be removed through the first source through hole SH1 such that the source area OPS, (see FIG. 2K) formed to expose bottoms of the first channel holes H1, opens between the first source seed layer 111 and the second source seed layer 119.

During the above-mentioned process of forming the second opening OP2, the first protective layer 113 and the second protective layer 117 may remain rather than being completely removed. Because the sidewall insulating layer 131 has the same multilayer structure as that of the first protective layer 113 and the second protective layer 117, the sidewall insulating layer 131 may remain rather than being completely removed during the process of forming the second opening OP2.

Figure 2J:
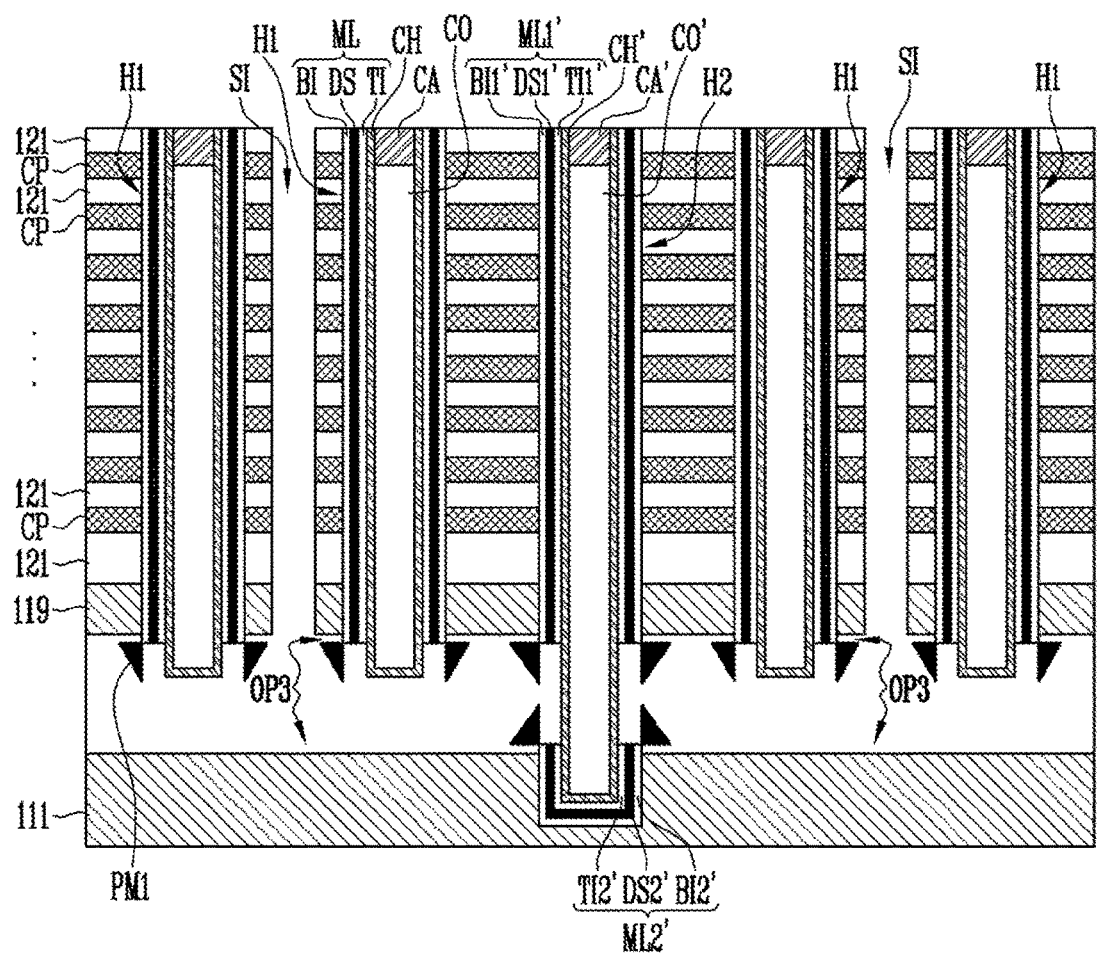

Referring to FIG. 2J, the first and second protective layers 113 and 117 exposed through the first opening OP1 are removed. The sidewall insulating layers 131 are also removed. Thereby, third openings OP3 are formed between the first source seed layer 111 and the second source seed layer 119.

The third openings OP3 along with the first opening OP1 expose the first and second source seed layers 111 and 119. Because the sidewall insulating layers 131 are removed, sidewalls of the second source seed layer 119 are exposed through the slits SI.

During the operation of removing the first and second protective layers 113 and 117, the first and second source seed layers 111 and 119 may be used as etch blocking layers because of a difference in etching selectivity between the first and second protective layers 113 and 117 and the first and second source seed layers 111 and 119.

Figure 2K:
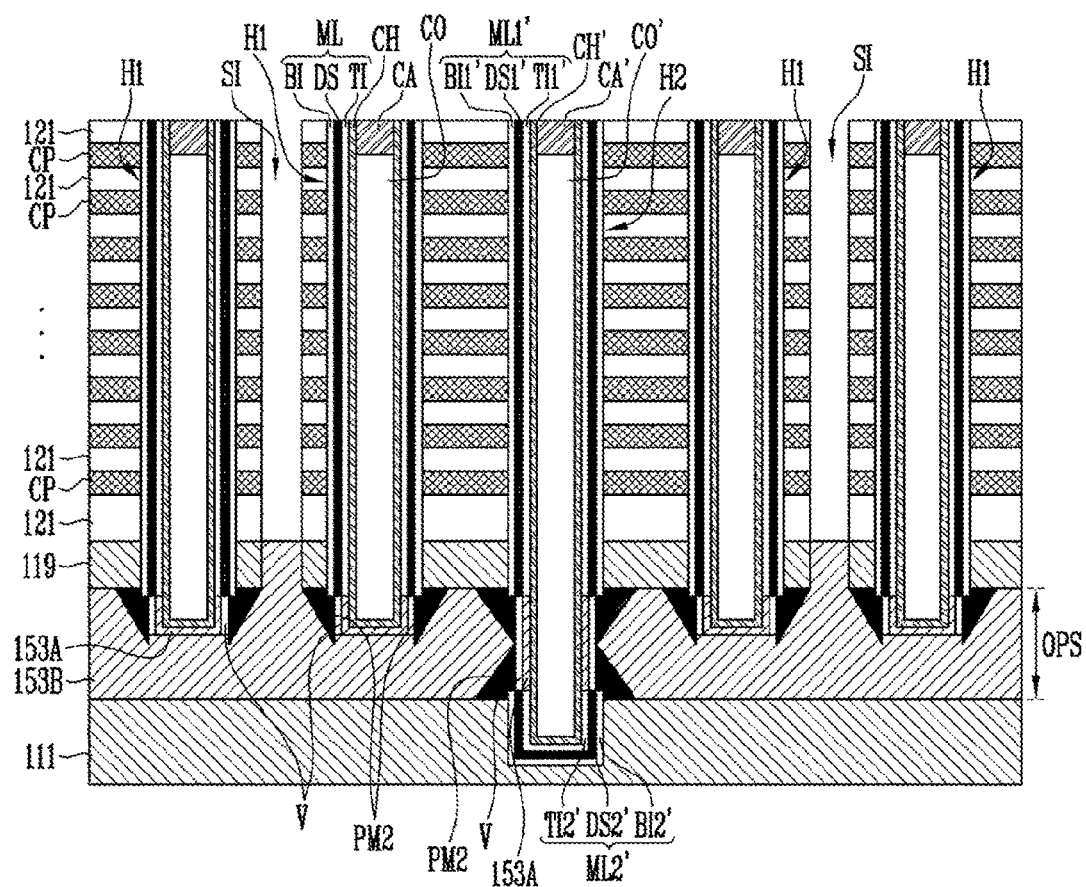

Referring to FIG. 2K, a first area 153A of the interlayer source layer is grown from the channel layers CH and CH' exposed in the source area OPS through the first and second openings OP1 and OP2. The first area 153A may be grown by a selective growing method.

Furthermore, a second area 153B of the interlayer source layer is grown from the first and second source seed layers 111 and 119 exposed in the source area OPS through the first and third openings OP1 and OP3. The second area 153B may also be grown by a selective growing method.

The polymers PM1 described with reference to FIG. 2H may react with materials for the growth of the interlayer source layer and further increase in size. As shown in FIG. 2K, the polymers PM2 that have increased in size may invade the second openings OP2 from which the multilayer layers ML and ML' have been removed, or invade the third openings OP3 from which the first and second protective layers 113 and 117 have been removed, or also invade the first opening OP1 from which the sacrificial layer 115 has been removed.

Therefore, the polymers PM2 may block the materials for the growth of the interlayer source layer from being drawn into the channel layers CH and CH', whereby the first area 153A of the interlayer source layer may no longer grow from the channel layers CH and CH'.

Therefore, voids V may be formed between the polymers PM2 and the first area 153A of the interlayer source layer. The voids V may block the interlayer source layer and the channel layers CH and CH' from coupling with each other, where the coupling may create an undesirable disconnection between the channel layer and the source layer may be caused.

With regard to this, in an embodiment of the present disclosure, the lower end of each channel layer CH is disposed between the first source seed layer 111 and the second source seed layer 119, that is, in the interlayer source layer, so that a path along which materials for growth of the interlayer source layer are moved may be formed in the source area OPS between the first source seed layer 111 and the second source seed layer 119. Even if the polymers PM2 are formed in the source area OPS, space in which the interlayer source layer is able to grow may be secured below each channel layer CH.

Therefore, even if voids V are formed, the channel layer CH and the interlayer source layer may be coupled to each other through the first area 153A of the interlayer source layer grown from each of the channel layers CH and through the second area 153B of the interlayer source layer grown from the first and second source seed layers 111 and 119.

In an embodiment of the present disclosure, the channel layer CH' extends a predetermined length such that the lower end thereof passes through a portion of the first source seed layer 111. Thus, it is impossible to secure a space for growth of the interlayer source layer. Thereby, the channel layer CH' may be coupled with the interlayer source layer and not function as a memory cell. However, because the lower end of the channel layer CH' extends a predetermined length to pass through a portion of the first source seed layer 111, the channel layer CH' may function to support the first source seed layer 111 and the second source seed layer 119. That is, the channel layer CH' may assist in forming the structure including the channel layers CH.

Figure 3:
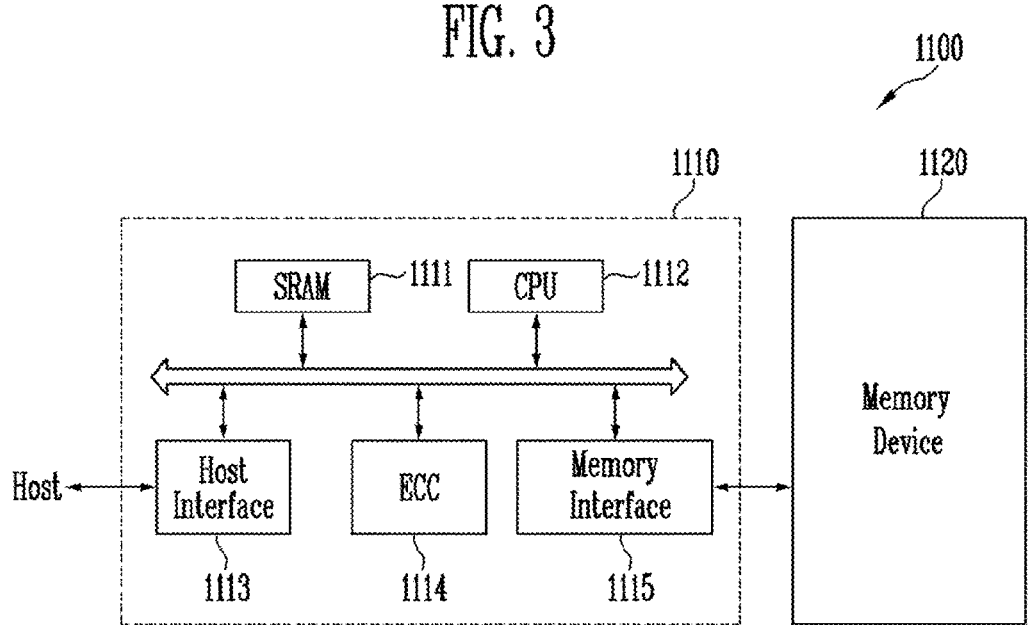
FIG. 3 is a block diagram illustrating a configuration of a memory system in accordance with an embodiment of the present disclosure.

FIG. 3 is a block diagram illustrating the configuration of a memory system 1100 according to an embodiment of the present disclosure.

Referring FIG. 3, the memory system 1100 in accordance with an embodiment includes a memory device 1120 and a memory controller 1110.

The memory device 1120 may include the configuration described with reference to FIG. 1. For example, the memory device 1120 may include a cell plug and a dummy plug which have different lengths and are formed in the source area between the first source seed layer and the second source seed layer. The memory device 1120 may be a multi-chip package including a plurality of flash memory chips.

The memory controller 1110 is configured to control the memory device 1120, and may include an SRAM (Static Random Access Memory) 1111, a CPU 1112, a host interface 1113, an ECC (Error Correction Code) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a ROM (Read Only Memory) or the like that stores code data for interfacing with the host.

The above-described memory system 1100 may be a memory card or an SSD (Solid State Disk) equipped with the memory device 1120 and the controller 1110. For example, when the memory system 1100 is an SSD, the memory controller 1110 may communicate with the outside (e.g., host) via one of various interface protocols, such as a USB (Universal Serial Bus), an MMC (MultiMedia Card), a PCI-E (Peripheral Component Interconnection-Express), an SATA (Serial Advanced Technology Attachment), a PATA (Parallel Advanced Technology Attachment), an SCSI (Small Computer Small Interface), an ESDI (Enhanced Small Disk Interface), or an IDE (Integrated Drive Electronics).

Figure 4:
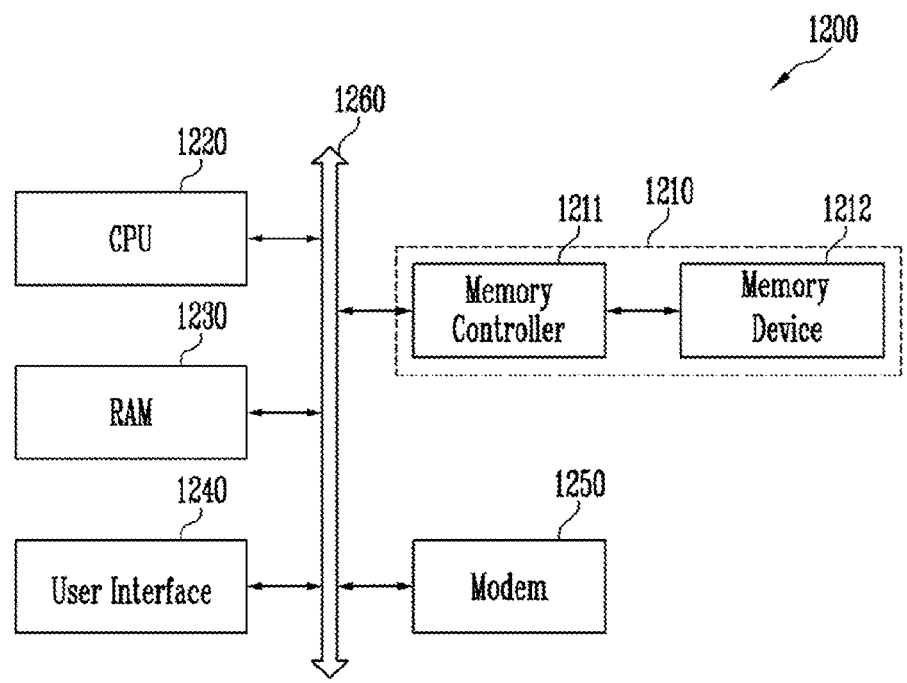
FIG. 4 is a block diagram illustrating a configuration of a computing system in accordance with an embodiment of the present disclosure.

FIG. 4 is a block diagram illustrating a configuration of a computing system 1200 in accordance with an embodiment of the present disclosure.

Referring to FIG. 4, the computing system 1200 in accordance with an embodiment of the present disclosure may include a CPU 1220, a RAM (Random Access Memory) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 3, the memory system 1210 may be configured with a memory device 1212 and a memory controller 1211.

The present disclosure makes it possible to reliably secure electrical characteristics of a source layer.

Furthermore, the present disclosure may enhance the operation reliability of a semiconductor device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor device comprising:
a first source seed layer;
a second source seed layer disposed over the first source seed layer at a position spaced apart from the first source seed layer with a source area interposed between the first source seed layer and the second source seed layer;
cell plugs configured to penetrate through the second source seed layer and extend into the source area, the cell plugs being disposed at positions spaced apart from the first source seed layer; and an interlayer source layer configured to fill the source area, wherein each of the cell plugs has a bottom coplanar with a surface of the interlayer source layer.

2. The semiconductor device according to claim 1, further comprising at least one dummy plug configured to penetrate through the second source seed layer and extend into the first source seed layer via the source area.

3. The semiconductor device according to claim 2, further comprising interlayer insulating layers and conductive patterns alternately stacked on the second source seed layer.

4. The semiconductor device according to claim 3, wherein the cell plugs and the at least one dummy plug extend to penetrate through the interlayer insulating layers and the conductive patterns.

5. The semiconductor device according to claim 2, wherein the at least one dummy plug extends toward the first source seed layer and penetrates through an upper portion of the first source seed layer, and the at least one dummy plug has a length greater than a length of each of the cell plugs.

6. The semiconductor device according to claim 2, wherein each of the cell plugs comprises:

a first channel layer configured to penetrate through the second source seed layer and extend into the source area; and a multilayer pattern configured to enclose an outer surface of a portion of the first channel layer that penetrates through the second source seed layer.

7. The semiconductor device according to claim 6, wherein the at least one dummy plug comprises:

a second channel layer configured to penetrate through the second source seed layer and extend into the first source seed layer via the source area;

a first multilayer pattern configured to enclose an outer surface of a first part of the second channel layer that penetrates through the second source seed layer; and a second multilayer pattern configured to enclose an outer surface of a second part of the second channel layer that penetrates through an upper portion of the first source seed layer.

8. The semiconductor device according to claim 7, wherein the first multilayer pattern and the second multilayer pattern are separated from each other by the interlayer source layer.

9. The semiconductor device according to claim 7, wherein the multilayer pattern and the first multilayer pattern are formed in the same layer.

10. The semiconductor device according to claim 7, wherein the multilayer pattern and the first and second multilayer patterns are formed of the same material.

11. The semiconductor device according to claim 6, wherein the multilayer pattern comprises:

a tunnel insulating layer configured to enclose the first channel layer;

a data storage layer configured to enclose the tunnel insulating layer; and a blocking insulating layer configured to enclose the data storage layer.

* * * * *